(12) United States Patent
Solomon et al.

(10) Patent No.: US 10,177,726 B1
(45) Date of Patent: Jan. 8, 2019

(54) WAVEGUIDE TO MICROSTRIP LINE N-PORT POWER SPLITTER/COMBINER

(71) Applicant: Space Systems/Loral, LLC, Palo Alto, CA (US)

(72) Inventors: David Max Solomon, San Mateo, CA (US); James J. Sowers, Sunnyvale, CA (US); Chihchien Lin, Cupertino, CA (US); Perry Alan Peterson, Mountain View, CA (US)

(73) Assignee: Space Systems/Loral, LLC, Palo Alto, CA (US)

( * ) Notice: Subject to any disclaimer, the term of this patent is extended or adjusted under 35 U.S.C. 154(b) by 250 days.

(21) Appl. No.: 15/201,208

(22) Filed: Jul. 1, 2016

(51) Int. Cl.
| | |
|---|---|
| *H01P 5/12* | (2006.01) |
| *H03F 3/60* | (2006.01) |
| *H01P 5/08* | (2006.01) |
| *H03F 3/19* | (2006.01) |
| *H03F 3/21* | (2006.01) |

(52) U.S. Cl.
CPC ............ *H03F 3/602* (2013.01); *H01P 5/085* (2013.01); *H01P 5/12* (2013.01); *H03F 3/19* (2013.01); *H03F 3/21* (2013.01); *H03F 2200/222* (2013.01); *H03F 2200/387* (2013.01); *H03F 2200/451* (2013.01)

(58) Field of Classification Search
CPC ... H03F 3/602; H03F 3/19; H03F 3/21; H03F 2200/222; H03F 2200/387; H03F 2200/451; H01P 5/085; H01P 5/12
See application file for complete search history.

(56) References Cited

U.S. PATENT DOCUMENTS

| | | | |
|---|---|---|---|
| 2,957,143 | A | 10/1960 | Enloe |
| 3,593,174 | A | 7/1971 | White |
| 4,092,516 | A | 5/1978 | Martin |
| 4,092,616 | A | 5/1978 | Osterwalder |
| 4,689,631 | A | 8/1987 | Gans |
| 5,365,197 | A | 11/1994 | Ikalainen |
| 5,550,513 | A | 8/1996 | Wong |
| 5,561,397 | A | 10/1996 | Kumar et al. |
| 5,880,648 | A | 3/1999 | Aves et al. |
| 6,396,349 | B2 | 5/2002 | Takei et al. |
| 6,614,590 | B2 | 9/2003 | Tatoh |
| 6,677,897 | B2 | 1/2004 | Livingston |
| 6,707,348 | B2 | 3/2004 | Ammar |

(Continued)

FOREIGN PATENT DOCUMENTS

| | | |
|---|---|---|
| JP | 2007/295368 | 11/2007 |
| WO | WO 2015/023204 | 2/2015 |

*Primary Examiner* — Robert J Pascal
*Assistant Examiner* — Kimberly E Glenn
(74) *Attorney, Agent, or Firm* — Weaver Austin Villeneuve & Sampson LLP

(57) ABSTRACT

A power splitting (or combining) arrangement includes a waveguide having a plurality of output (or input) ports and an input (or output) port configured to receive (or transmit) electromagnetic waves having a frequency in a designated frequency band. Each output (or input) port is configured to electrically couple with an input (or output) terminal of a corresponding one of a plurality of active devices. Each output (or input) port has a respective output impedance associated with the frequency band. The power splitting (or combining) arrangement is configured such that the respective output (or input) impedance of each output (or input) port substantially matches an input (or output) impedance of the corresponding one of the plurality of active devices.

20 Claims, 8 Drawing Sheets

(56) References Cited

U.S. PATENT DOCUMENTS

| | | |
|---|---|---|
| 7,358,803 B2 | 4/2008 | Goldberg et al. |
| 7,397,308 B2 | 7/2008 | Mordarski |
| 9,065,163 B1 | 6/2015 | Wu et al. |
| 2002/0105383 A1 | 8/2002 | Cheo |
| 2004/0108903 A1 | 6/2004 | Channabasappa et al. |
| 2005/0068249 A1 | 3/2005 | Du Toit et al. |
| 2007/0280576 A1 | 12/2007 | Kucharski et al. |
| 2013/0154773 A1 | 6/2013 | Siprak |
| 2014/0145794 A1 | 5/2014 | Coutney et al. |

WAVEGUIDE TO MICROSTRIP LINE N-PORT POWER SPLITTER/COMBINER

TECHNICAL FIELD

This invention relates generally to a radio frequency (RF) power splitter/combiner, and more particularly to RF power splitters/combiners implemented in power amplification or other implementations involving splitting and/or combining RF pathways.

BACKGROUND OF THE INVENTION

The assignee of the present invention designs and manufactures spacecraft for, inter alia, communications and broadcast services from geosynchronous orbit. Payloads of such spacecraft operating at microwave and millimeter-wave frequencies may include arrangements that combine multiple solid state devices to achieve high levels of power. Within such arrangements, conventional power-splitting or power-combining structures require external passive circuitry to match an impedance of an input (or output) port to an impedance of a corresponding output (or input) terminal of a traditional amplifier or other RF component. By way of example, an output port of a conventional power-splitter may be coupled with a monolithic microwave integrated circuit (MMIC), which contains impedance matching circuitry.

In the absence of the present teachings, conventional power-splitting or power-combining structures suffer insertion and mismatch loss introduced by use of the impedance matching circuitry described in the preceding paragraph, resulting in undesirable efficiency loss.

An improved power-splitting or power-combining structure suffering reduced insertion and mismatch loss is desirable.

SUMMARY OF INVENTION

The present inventors have appreciated that a power splitting arrangement that includes an input waveguide that has a plurality of output ports and an input port configured to receive electromagnetic waves having a frequency in a designated frequency band may be arranged such that each output port is electrically coupled with an input terminal of a corresponding active device. Each output port has an output impedance that is configured to substantially match an input impedance of the corresponding active device. The arrangement enables a lower-loss layout and obviates a need for impedance matching circuitry between output ports of the power splitting arrangement and respective active devices, particularly for a cavity waveguide operating in a TE type waveguide mode. As discussed below, similar impedance matching techniques can be applied to eliminate the need for impedance matching circuitry between input ports of a power combining arrangement and respective active devices.

According to some implementations, an apparatus includes a power splitting arrangement including a waveguide having a plurality of output ports and an input port configured to receive electromagnetic waves having a frequency in a designated frequency band. Each output port is configured to electrically couple with an input terminal of a corresponding one of a plurality of active devices. Each output port has a respective output impedance associated with the frequency band. The power splitting arrangement is configured such that the respective output impedance of each output port substantially matches an input impedance of the corresponding one of the plurality of active devices such that the power splitting arrangement is configured to provide either or both of a return loss that is not worse than 15 decibels, or an insertion loss that is not worse than 0.2 decibels.

In some examples, at least one of the plurality of active devices may include a transistor amplifier and do not include impedance matching circuitry. In some examples, each output port may be electrically coupled with or may directly connect to the input terminal of the corresponding one of the plurality of active devices only by way of a microstrip line.

In some examples, the power splitting arrangement may include an input splitter waveguide, and the apparatus may further include a serially fed output combiner waveguide having a plurality of input ports, each input port being configured to electrically couple or directly connect to with an output terminal of a corresponding one of the plurality of active devices.

In some examples, a first one of the output ports may include a first coaxial interface that is electrically coupled with the waveguide by way of a first coaxial feedthrough, the first coaxial interface being configured to electrically couple with or directly connect to the input terminal of the corresponding active device. The first coaxial interface may include an electrically conductive core, a cylindrical layer comprising a dielectric material, the cylindrical layer surrounding the electrically conductive core, and an electrically conductive shell surrounding the dielectric material. In some examples, an inner diameter of the cylindrical layer of the first coaxial interface and an outer diameter of the cylindrical layer of the first coaxial interface may be configured such that the output impedance of the first output port substantially matches the input impedance of the corresponding one of the plurality of active devices. In some examples, the dielectric material of the first coaxial interface may have a relative permittivity configured such that the first output port has an output impedance that matches the input impedance of the input terminal of the corresponding active device.

In some examples, the waveguide may include one or more internal impedance matching components, the internal impedance matching components being configured to substantially match an impedance of the waveguide with input impedances of the output ports. In some examples, the internal impedance matching components may include one or more electrically conductive screws embedded in a first wall of the waveguide, wherein a number, a placement, a depth, and/or a diameter of the conductive screws is configured to substantially match the impedance of the waveguide with input impedances of the output ports. In some examples, the impedance matching components may include at least one step in a first wall of the waveguide, wherein a number, a placement, and/or a depth of the at least one step is configured to substantially match an impedance of the waveguide with input impedances of the output ports.

According to some implementations, an apparatus includes a power combining arrangement including a waveguide having a plurality of input ports and an output port configured to transmit electromagnetic waves having a frequency in a designated frequency band. Each input port is configured to electrically couple with or directly connect to an output terminal of a corresponding one of a plurality of active devices. Each input port has a respective input impedance associated with the frequency band. The power combining arrangement is configured such that the respective input impedance of each input port substantially matches an output impedance of the corresponding one of the plurality of active devices such that the power combining arrangement is configured to provide either or both of a return loss that is not worse than 15 decibels, or an insertion loss that is not worse than 0.2 decibels.

According to some implementations, an apparatus includes an input splitter waveguide having a plurality of output ports and an input port configured to receive electromagnetic waves having a frequency in a designated frequency band, an output combiner waveguide having a plurality of input ports and an output port configured to transmit electromagnetic waves having a frequency in a designated frequency band, and a plurality of active devices. Each output port of the input splitter waveguide is configured to electrically couple with or directly connect to an input terminal of a corresponding one of the plurality of active devices. Each output port of the input splitter waveguide has a respective output impedance associated with the frequency band. The power splitting arrangement is configured such that the respective output impedance of each output port of the input splitter waveguide substantially matches an input impedance of the corresponding one of the plurality of active devices such that the power splitting arrangement is configured to provide either or both of a return loss that is not worse than 15 decibels, or an insertion loss that is not worse than 0.2 decibels. Each input port of the output combiner waveguide is configured to electrically couple with an output terminal of a corresponding one of the plurality of active devices. Each input port of the output combiner waveguide has a respective input impedance associated with the frequency band. The power combining arrangement is configured such that the respective input impedance of each input port of the output combiner waveguide substantially matches an output impedance of the corresponding one of the plurality of active devices such that the power combining arrangement is configured to provide either or both of a return loss that is not worse than 15 decibels, or an insertion loss that is not worse than 0.2 decibels.

BRIEF DESCRIPTION OF THE DRAWINGS

Features of the invention are more fully disclosed in the following detailed description of the preferred embodiments, reference being had to the accompanying drawings, in which.

Figure 1:
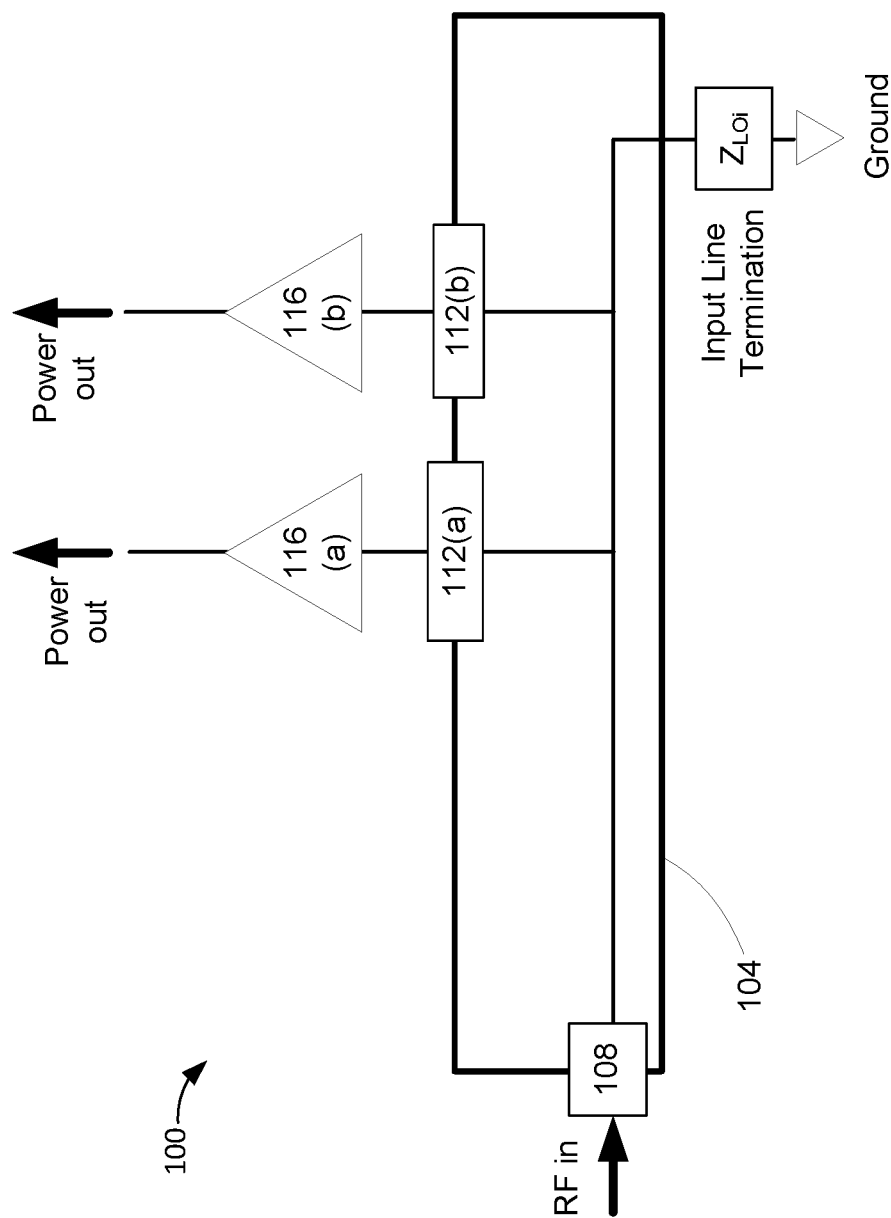
FIG. 1 illustrates a schematic diagram of an example of a power splitting arrangement, in accordance with some implementations.

Throughout the drawings, the same reference numerals and characters, unless otherwise stated, are used to denote like features, elements, components, or portions of the illustrated embodiments. Moreover, while the subject invention will now be described in detail with reference to the drawings, the description is done in connection with the illustrative embodiments. It is intended that changes and modifications can be made to the described embodiments without departing from the true scope and spirit of the subject invention as defined by the appended claims.

DETAILED DESCRIPTION

Specific exemplary embodiments of the invention will now be described with reference to the accompanying drawings. This invention may, however, be embodied in many different forms, and should not be construed as limited to the embodiments set forth herein. Rather, these embodiments are provided so that this disclosure will be thorough and complete, and will fully convey the scope of the invention to those skilled in the art.

It will be understood that when an element is referred to as being "connected" or "coupled" to another element, it can be directly connected or coupled to the other element, or intervening elements may be present. Furthermore, "connected" or "coupled" as used herein may include wirelessly connected or coupled. It will be understood that although the terms "first" and "second" are used herein to describe various elements, these elements should not be limited by these terms. These terms are used only to distinguish one element from another element. Thus, for example, a first user terminal could be termed a second user terminal, and similarly, a second user terminal may be termed a first user terminal without departing from the teachings of the present invention. As used herein, the term "and/or" includes any and all combinations of one or more of the associated listed items. The symbol "/" is also used as a shorthand notation for "and/or".

The terms "spacecraft", "satellite" and "vehicle" may be used interchangeably herein, and generally refer to any orbiting satellite or spacecraft system.

Embodiments disclosed hereinbelow include significant improvements to a splitting or combining structure of an RF power amplifier suitable for use in microwave and millimeter wave applications, for example. In the absence of the presently disclosed techniques, power-splitting or power-combining structures require additional external passive circuitry to impedance match to the input (or output) terminals of active devices. By way of example, an output port of a conventional power-splitter may be coupled with a monolithic microwave integrated circuit (MMIC), which contains impedance matching circuitry. Such impedance matching circuitry can introduce insertion and mismatch loss, resulting in inefficiency. The presently disclosed techniques, on the other hand, allow for impedance matching to be done within a splitting or combining structure such that the splitting or combining structure can couple directly with an active device such as a transistor amplifier. As a result, a need for including high-loss impedance matching circuitry in such active devices is obviated, resulting in increased efficiency and a simplified design. Advantageously, an enclosed waveguide contains internal matching circuitry and provides a media that enables higher efficiency and Q-factor than other matching methods such as, for example, a matching implementation composed of microstrip or lumped elements.

The terms "matched" and "substantially match" may be used interchangeably herein to describe impedance matching of two or more components of an apparatus. The impedances of the two or more components of a splitting (or combining) arrangement are described herein as matching or substantially matching if the impedances are sufficiently matched such that insertion and/or return loss are reduced. By way of example, as shown below, impedances of components of a splitting (or combining) arrangement disclosed herein may be substantially matched such that the splitting (or combining) arrangement performs with return loss not worse than 15 decibels when receiving (or transmitting) electromagnetic waves in a designated frequency band. Also or alternatively, as shown below, impedances of components of a splitting (or combining) arrangement disclosed herein may be substantially matched such that the splitting (or combining) arrangement performs with insertion loss not worse than 0.2 decibels when receiving (or transmitting) electromagnetic waves in a designated frequency band.

FIG. 1 illustrates a schematic diagram of an example of a power splitting arrangement, in accordance with some implementations. In the illustrated implementation, a 3-port power splitting arrangement 100 includes a cavity waveguide 104 having an input port 108. The input port 108 may be configured to receive electromagnetic waves having a frequency in a designated radio frequency (RF) band. Waveguide 104 also includes output ports 112(a) and 112 (b). Each of output ports 112(a) and 112(b) may be configured to distribute power evenly to respective active devices 116(a) and 116(b). The respective active devices may be transistor amplifiers that, advantageously, avoid the use of intermediate impedance matching circuitry. In some implementations, each of ports 112(a) and 112(b) may be configured to electrically couple with an input terminal of a corresponding active device 116(a) and 116(b) by way of a microstrip line without any intervening impedance matching circuitry.

Each of the output ports 112(a) and 112(b) has a respective output impedance associated with the designated RF band. As described in further detail below, splitting arrangement 100 may be configured such that the respective output impedance of each of ports 112(a) and 112(b) substantially matches an input impedance of a corresponding active device 116(a) and 116(b). Matching techniques obviating the need for intermediate impedance matching circuitry are described in further detail below.

Figure 2:
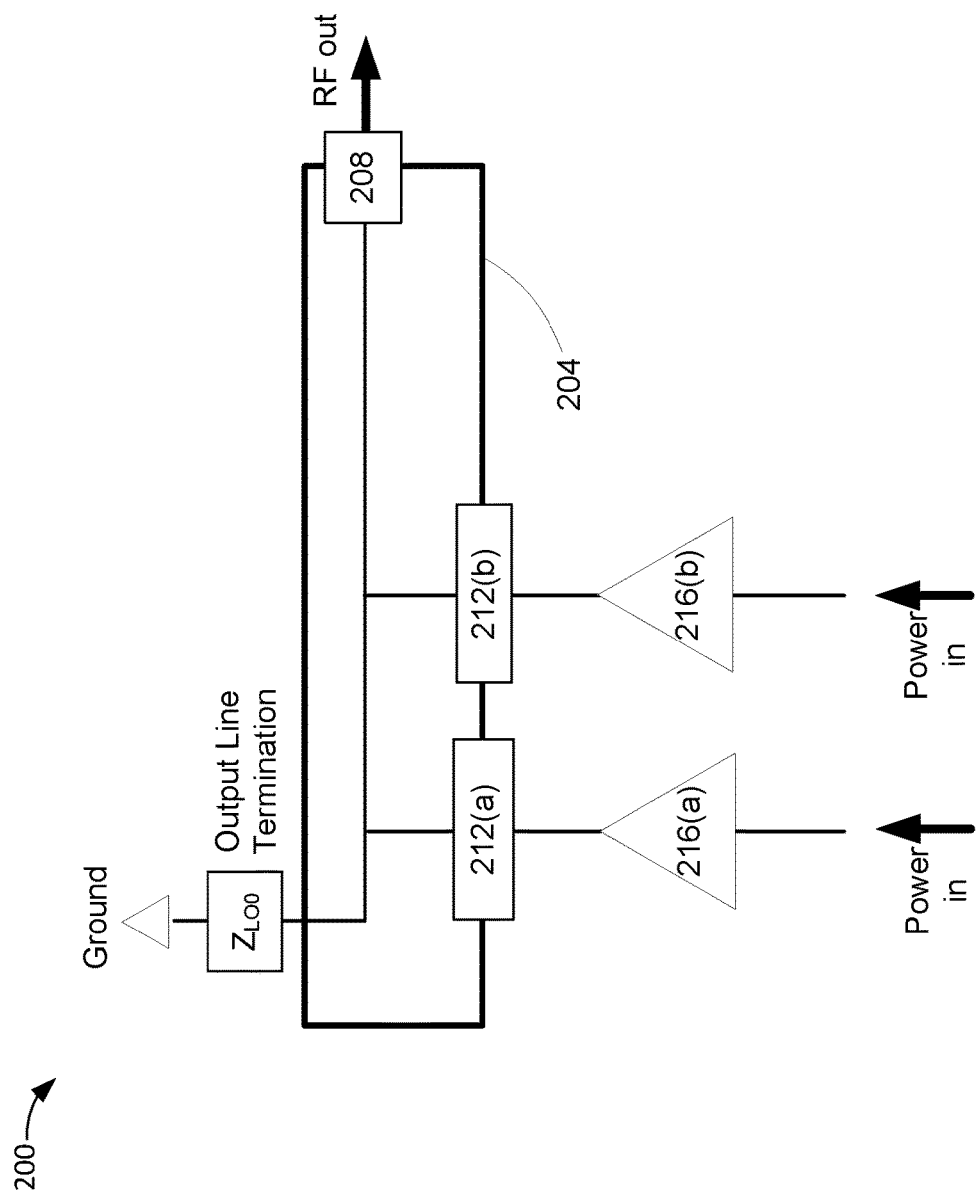
FIG. 2 illustrates a schematic diagram of an example of a power combining arrangement, in accordance with some implementations.

FIG. 2 illustrates a schematic diagram of an example of a power combining arrangement, in accordance with some implementations. In the illustrated implementation, a 3-port power combining arrangement 200 includes a cavity waveguide 204 having an output port 208. The output port 208 may be configured to transmit electromagnetic waves having a frequency in a designated RF band. The waveguide 204 also includes input ports 212(a) and 212(b). Each of the input ports 212(a) and 212(b) may be configured to receive power from a respective active device 216(a) and 216(b). The respective active devices may be transistor amplifiers without intermediate impedance matching circuitry. In some implementations, each of the input ports 212(a) and 212(b) may be configured to electrically couple with an output terminal of a corresponding active device 216(a) and 216(b) by way of a microstrip line without any intervening impedance matching circuitry.

Each of the input ports 212(a) and 212(b) has a respective input impedance associated with the designated RF band. As described in further detail below, combining arrangement 200 may be configured such that the respective input impedance of each of ports 212(a) and 212(b) substantially matches an output impedance of a corresponding active device 216(a) and 216(b).

Figure 3:
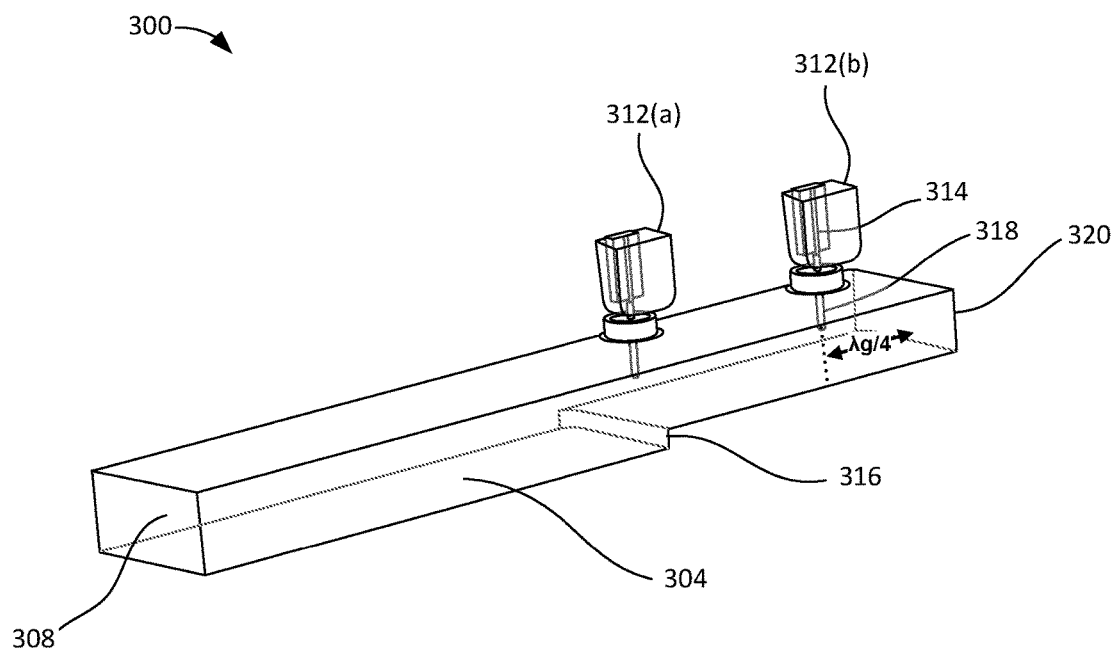
FIG. 3 illustrates an example of a power splitting or power combining arrangement, in accordance with some implementations.

It will be understood that splitting arrangements discussed herein may also or alternatively function as combining arrangements and vice-versa. FIG. 3 illustrates an example of a power splitting or power combining arrangement, in accordance with some implementations. When arrangement 300 of FIG. 3 is functioning as a splitting arrangement, port 308 may function as an input port that is configured to receive electromagnetic waves and ports 312(a) and 312(b) may function as output ports that are configured to distribute power evenly to an input terminal of a respective active device such as a transistor amplifier. Alternatively, if arrangement 300 of FIG. 3 is functioning as a combining arrangement, port 308 may function as an output port that is configured to transmit electromagnetic waves and ports 312(a) and 312(b) may function as input ports that are configured to receive power from an output terminal of a respective corresponding active device.

Figure 4:
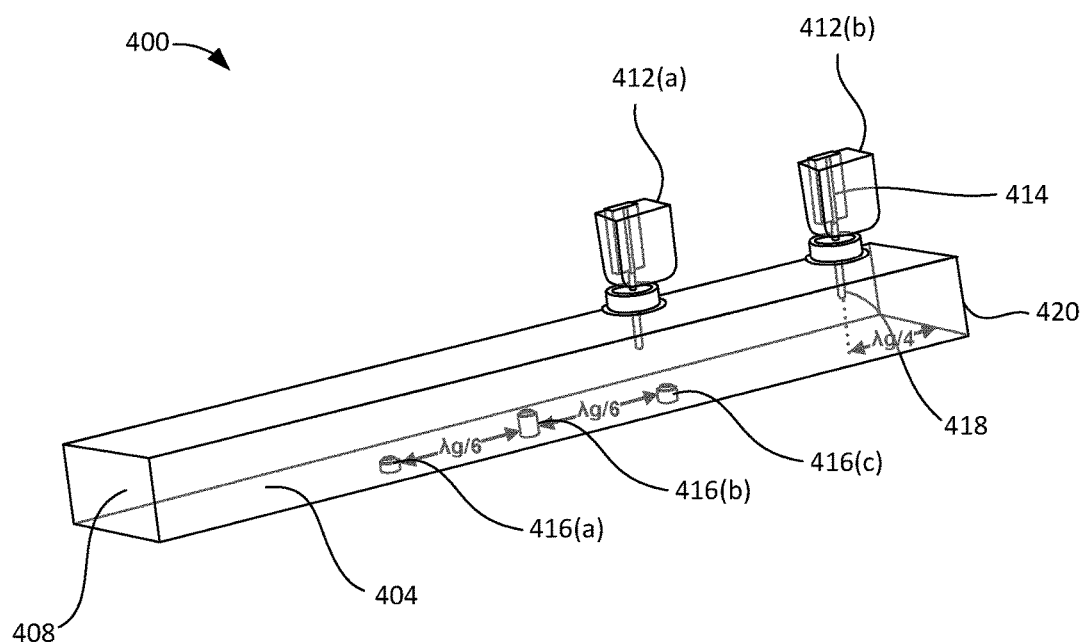
FIG. 4 illustrates an example of a power splitting or power combining arrangement, in accordance with some implementations.

Referring still to FIG. 3 an example of a 3-port splitting (or combining) arrangement 300 is illustrated. Arrangement 300 may function as the splitting arrangement 100 represented schematically in FIG. 1. Alternatively, arrangement 300 may function as the combining arrangement 200 represented schematically in FIG. 2. Arrangement 300 includes a waveguide 304 having an input (or output) port 308 and a backshort wall 320. The port 308 may be configured to receive (or transmit) electromagnetic waves. The waveguide 304 may also include output (or input) ports 312(a) and 312(b). Each of the output (or input) ports 312(a-b) may be configured to distribute (or receive) power to (or from) a corresponding active device. For example, as depicted in FIGS. 3 and 4, each of ports 312(a) and 312(b) may be electrically coupled with or directly connected to an input (or output) terminal of a corresponding active device by way of microstrip lines 314 while, advantageously, avoiding the use of intermediate impedance matching circuitry. In some implementations, ports 312(a) and 312(b) may include a coaxial feedthrough pin. Each coaxial feedthrough pin may, for example, be ribbon bonded directly to microstrip lines 314, which may connect directly to an input (or output) terminal of corresponding active device.

Output (or input) ports of a splitting (or combining) arrangement can take a variety of forms and be placed in a variety of manners. For instance, while splitting (or combining) arrangement 300 of FIG. 3 includes two coaxial output (or input) ports, the number or forms of such ports can vary across implementations. For example, a splitting (or combining) arrangement can include one or more output (or input) ports. In some implementations, each port may include a coaxial interface that includes an electrically conductive core, a cylindrical layer comprising a dielectric material that surrounds the electrically conductive core, and an electrically conductive shell surrounding the cylindrical layer. For example, ports 312(a) and 312(b) may include a coaxial interface electrically coupled with waveguide 304 via coaxial feedthrus 318 respectively. Such coaxial interfaces can be configured to electrically couple with or directly connect to an input (or output) terminal of a corresponding active device.

In some implementations, various attributes of such coaxial interfaces can be varied to achieve a desired output (or input) impedance of an output (or input) port. For example, the dimensions of a coaxial interface can be adjusted to achieve a desired impedance to match the input (or output) impedance of a respective active device. By way of illustration, instead of using standard 50Ω coaxial output (or input) ports, the coaxial interface of a port can be dimensionally adjusted (e.g. the ratio of the outer diameter of the dielectric portion to the inner diameter of the dielectric portion can be increased/decreased to proportionally increase/decrease the impedance of the coaxial interface). Also or alternatively the relative permittivity of the dielectric material can be changed such that a port has an output (or input) impedance that matches the input (or output) impedance of any given active device, e.g. the relative permittivity of the dielectric material used in a coaxial interface may be increased/decreased in order to proportionally decrease/increase the impedance of the coaxial interface. By way of example, a coaxial output port can be configured to couple directly with an active device having an input impedance of (20+30i)Ω.

In addition, or alternatively, to including a coaxial interface an output (or input) port of a waveguide may be coupled with other arrangements, such as a microstrip on substrate interface. Such arrangements may be configured to match the impedance of an output (or input) port of a waveguide and an input (or output) terminal of an active device.

Various additional impedance matching techniques can be used to fine-tune the output (or input) impedance of a splitting (or combining) arrangement. For example, in the splitting (or combining) arrangement shown in FIG. 3, the waveguide structure 308 includes discontinuities in terms of a wall inside the waveguide. More particularly, at least one step 316 is illustrated by way of example. The number, placement and height of such steps 316 can be configured to achieve a desired output (or input) impedance match between the impedance of the waveguide and output (or input) impedances of the input (or output) ports of the splitting (or combining) arrangement. For example, in FIG. 3, the step 316 is placed approximately ¼ of a guide wavelength away from a center of port 312(a) and is used to achieve a match between the impedance of waveguide 304 with output (or input) impedances of ports 312(a-b). In other implementations, spacing of the waveguide step to the center of port 312(a) may be varied from ¼ guide wavelength with other parameters optimized in the waveguide structure for performance.

Referring now to FIG. 4, another example of a 3-port splitting (or combining) arrangement 400 is illustrated. Arrangement 400 may function as the splitting arrangement 100 represented schematically in FIG. 1. Alternatively, arrangement 400 may function as the combining arrangement 200 represented schematically in FIG. 2. Arrangement 400 includes a waveguide 404 having an input (or output) port 408 and a backshort wall 420. The port 408 may be configured to receive (or transmit) electromagnetic waves. The waveguide 404 may also include output (or input) ports 412(a) and 412(b). Each of the output (or input) ports 412(a) and 412(b) may be configured to distribute (or receive) power to (or from) a corresponding active device. For example, as depicted in FIG. 4, each of ports 412(a) and 412(b) may be electrically coupled with an input (or output) terminal of a corresponding active device only by way of microstrip lines 414 respectively.

In the illustrated implementation, matching screws 416(a), 416(b) and 416(c) composed of an electrically conductive material can be included in a wall of the waveguide of the splitting (or combining) arrangement 400 to vary inductive and/or capacitive reactance of a waveguide and achieve a network impedance match between components of the splitting (or combining) arrangement. Such a network impedance match may include a match between the impedance of the waveguide and output (or input) impedances of the input (or output) ports of the splitting (or combining) arrangement. For instance, the number, placement, depth, and/or diameter of such screws can be varied using standard techniques to achieve a match between the impedance of a waveguide with output (or input) impedances of input (or output) ports. By way of example, in FIG. 4, the three matching screws 416(a)-(c) are spaced approximately ⅙ guide wavelength apart where the screw 416(c) nearest backshort wall 420 and a center of feedthru pin of port 412(a) are approximately the same distance from backshort wall 420. The screws 416(a)-(c) may be inserted to varying depths to achieve a match between the impedance of waveguide 404 with output (or input) impedances of ports 412(a-b). In other implementations, the spacing between matching screws 416(a-c) may be varied from ⅙ guide length relative to other parameters optimized in the waveguide structure for performance.

In both implementations shown in FIGS. 3 and 4, distance of the center of 312(b) and 412(b) from their respective backshorts (320 and 420 respectively) can be approximately ¼ guide wavelength (or n times ¼ guide wavelengths where n is an integer). It will be appreciated that the aforementioned distance may be varied relative to other parameters for purposes of optimizing performance, for example.

In some implementations, output (or input) ports of a waveguide of a splitting (or combining) arrangement can be sized and spaced to maximize even power distribution between ports while minimizing return loss over as wide a band as possible. For example, in some implementations, such output (or input) ports can be offset with respect to the centerline of the wide dimension of the waveguide to further increase bandwidth.

Figure 5:
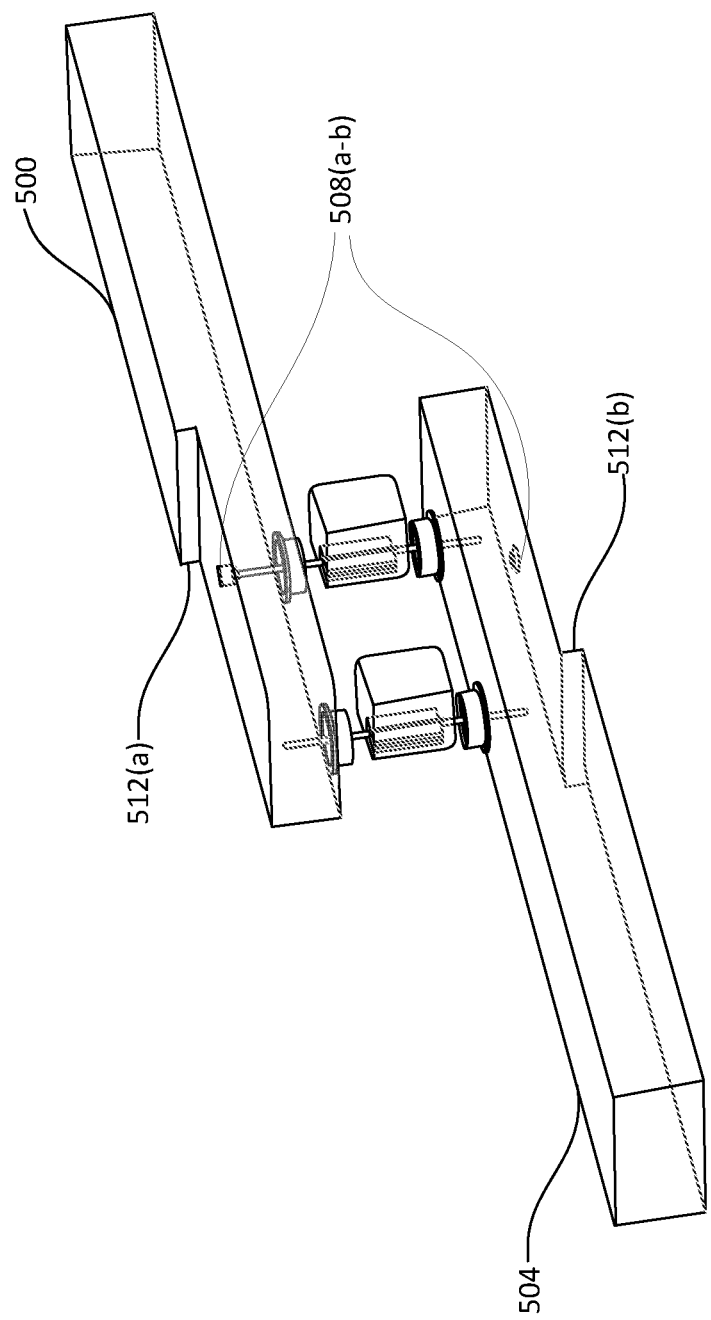
FIG. 5 illustrates an example of a power splitting arrangement coupled with a power combining arrangement, in accordance with some implementations.

Also or alternatively, the apparatuses disclosed herein can be used in conjunction with existing power combining arrangements to eliminate the need for multiple waveguide inputs and outputs for each amplifier pathway. Instead, as illustrated in FIG. 5, only a single input waveguide 500 and a single output waveguide 504 are needed since power splitting and combining can be attained inside each respective waveguide and power can be distributed via electrically coupled coaxial output (or input) ports. Such splitting and combining can be achieved using some of the techniques described in U.S. patent application Ser. No. 14/729,883 SOLID STATE TRAVELING WAVE AMPLIFIER FOR SPACE APPLICATIONS filed on Jun. 3, 2015, which is hereby incorporated by reference in its entirety and for all purposes.

In some implementations, a waveguide of a splitting (or combining) arrangement can include both matching screws and discontinuities. For example, waveguides 500 and 504 of FIG. 5 each include tuning screws 508(a) and 508(b) as well as steps 512(a) and 512(b) respectively. As described above, tuning screws 508(a) and 508(b) and steps 512(a) and 512(b) may be placed in a form and manner to achieve impedance matching between waveguides and input (or output) ports.

Figure 6:
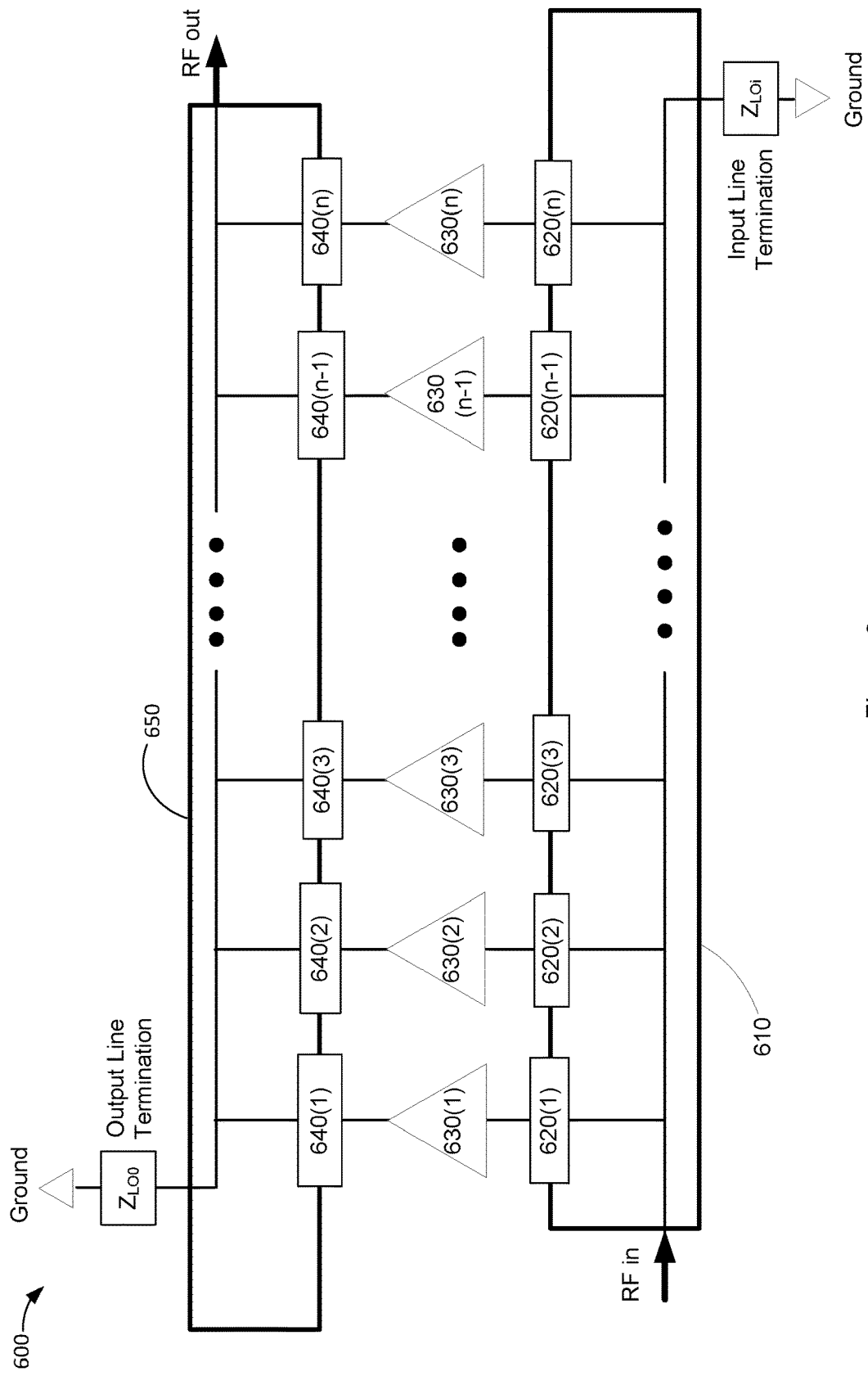
FIG. 6 illustrates an example of a schematic of an amplifier including a power splitting arrangement coupled with a power combining arrangement, in accordance with some implementations.

The apparatuses disclosed herein may be used with any arbitrary number of ports and active devices. For example, referring to FIG. 6, power combining arrangement 600 includes input splitter waveguide 610 and serially fed output combiner waveguide 650. In some implementations, one or both of splitter waveguide 610 and combiner waveguide 650 may take the form of any of the waveguides described above such as waveguides 304 and 404 of FIGS. 3 and 4. A plurality of amplifiers 630 couple and amplify RF energy from splitter waveguide 610 into combiner waveguide 650, as discussed above, amplifiers 430 can be simple transistor amplifiers that do not include any impedance matching circuitry. Alternatively, some or all amplifiers 630 may be or include monolithic microwave integrated circuit (MMIC) amplifiers.

Each amplifier 630 has a respective coupling 620 with splitter waveguide 610 and a respective coupling 640 with combiner waveguide guide 650. Each coupling 620 may include any of the ports described above and may include a low loss transition between a first microstrip terminal of amplifier 630 and a respective output port of the splitter waveguide 610. Similarly, each coupling 640 may include any of the ports described above and may include a low loss transition between a second microstrip terminal of amplifier 630 and a respective input port of combiner waveguide 650.

Figure 7A:
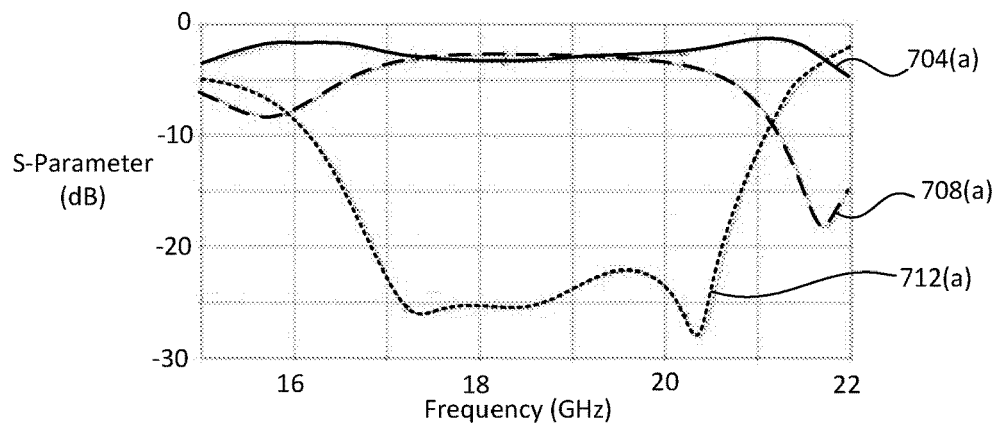
FIGS. 7A-7C illustrate examples of performance graphs, in accordance with some implementations.
Figure 7B:
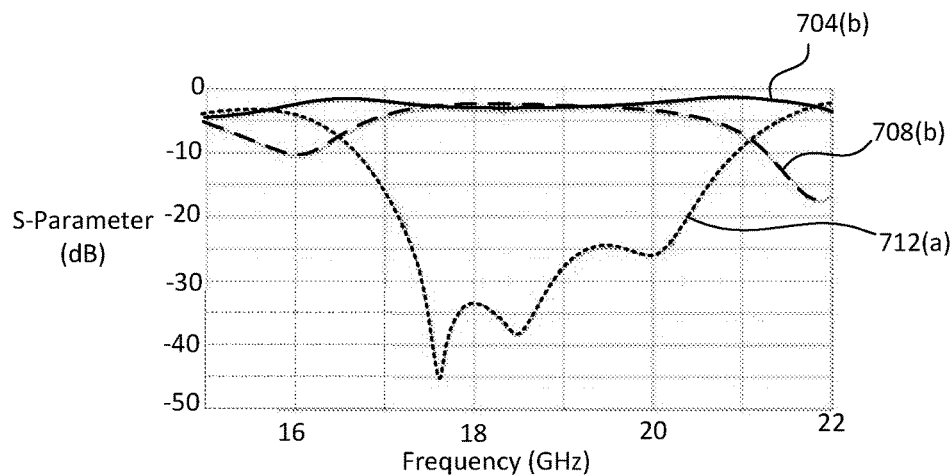
Figure 7C:
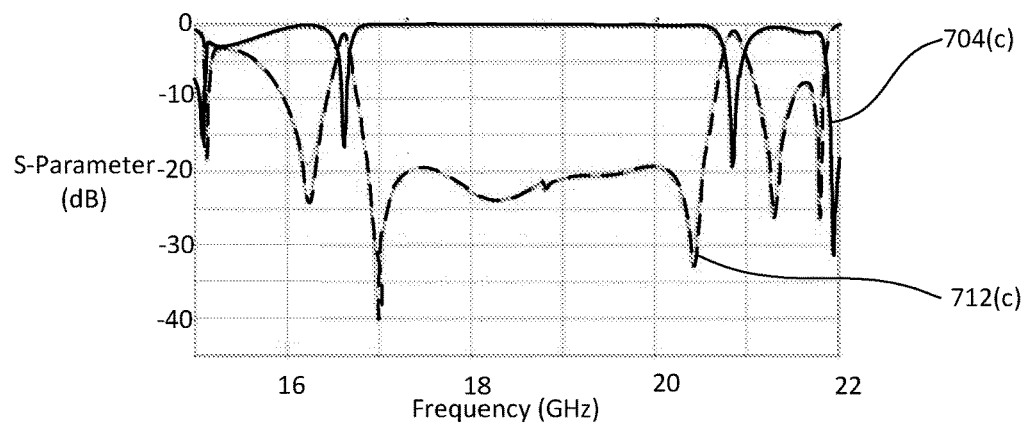

As discussed above, the power splitting (or combining) arrangements disclosed herein eliminate the insertion and mismatch loss introduced by impedance matching circuitry that is used in conventional power splitting (or combining) arrangements. For example, FIGS. 7A-C each show performance graphs of simulation results for the configurations depicted in FIGS. 3-5 respectively. Curves 704 (*a*) of FIG. 7A and 704(*b*) of FIG. 7B depict, respectively, the insertion loss from port 308 of FIG. 3 through port 312(*a*) and from port 408 of FIG. 4 through port 412(*a*). Similarly, curves 708 (*a*) of FIG. 7A and 708(*b*) of FIG. 7B depict, respectively, the insertion loss from port 308 of FIG. 3 through port 312(*b*) and from port 408 of FIG. 4 through port 412(*b*). It may be observed that curves 704 (*a-b*) and 708 (*a-b*) are relatively flat and of similar magnitude (approximately −3 dB) in the 17-20 GHz frequency range. Accordingly, the configurations depicted in FIGS. 3-5 are shown to have relatively flat insertion loss in this frequency range per each respective port. Curve 704(*c*) depicts the insertion loss of the directly combined splitter and combiner system (creating a 2-port network) which is flat over the frequency range of 17 to 20 GHz and low combined insertion loss of approximately 0.3 dB. Curves 712(*a-c*) of FIGS. 7A-C depict the return loss of the input ports of the waveguides depicted in FIGS. 3-5 respectively, demonstrating minimal reflection.

Figure 8:
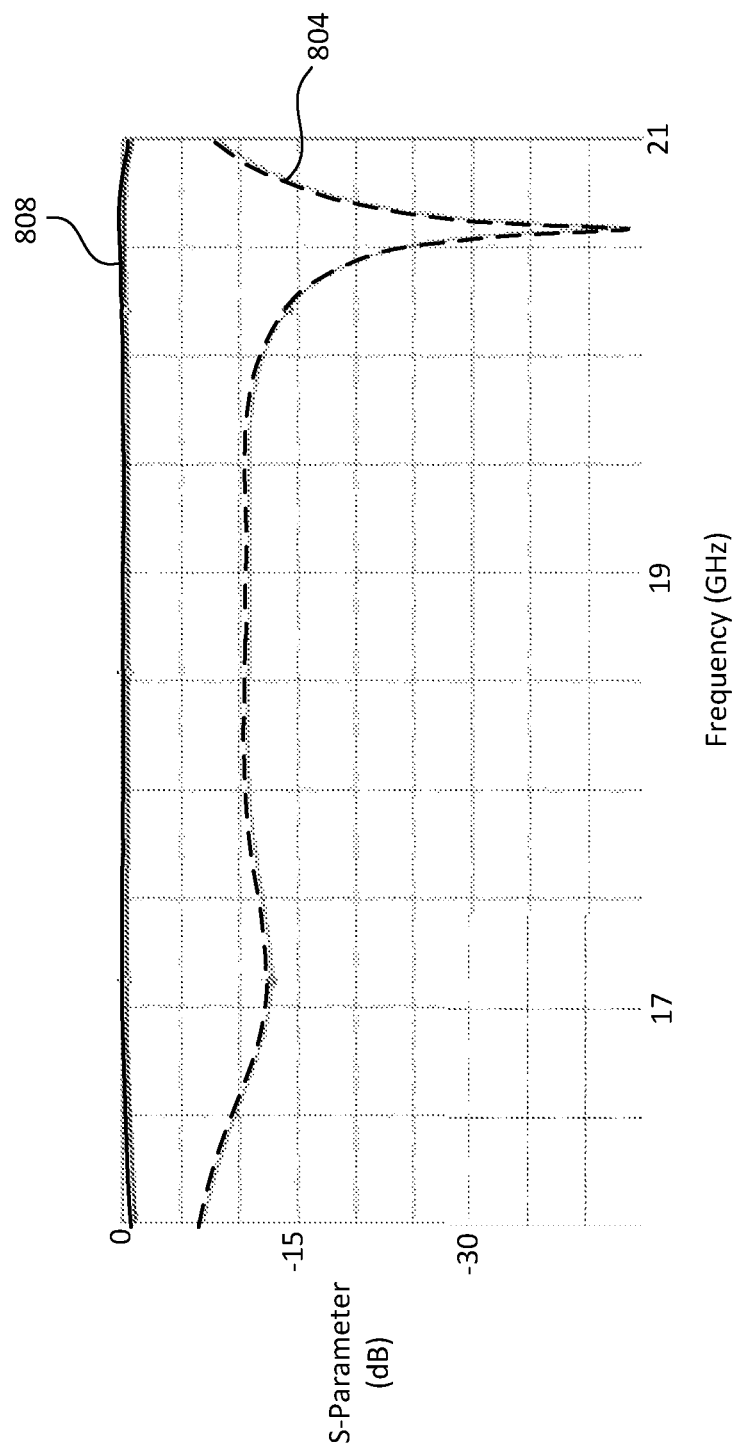
FIG. 8 illustrates an example of a performance graph depicting simulation results for a conventional power splitting (or combining) arrangement.

FIG. 8 shows an example of a performance graph depicting simulation results for a conventional power splitting (or combining) arrangement in which the impedance of the output port does not substantially matches an input impedance of the load. This conventional arrangement includes a fixed 50 ohm heritage waveguide to microstrip transition that is connected with a 35 ohm load. The return loss of this arrangement, depicted by curve 804 of FIG. 8, is approximately 11 dB within a frequency range of 17 to 20 GHz. Additionally, the insertion loss of this arrangement, depicted by curve 808 of FIG. 8, ranges from 0.28 to 0.48 dB within a frequency range of 17 to 20 GHz.

Figure 9:
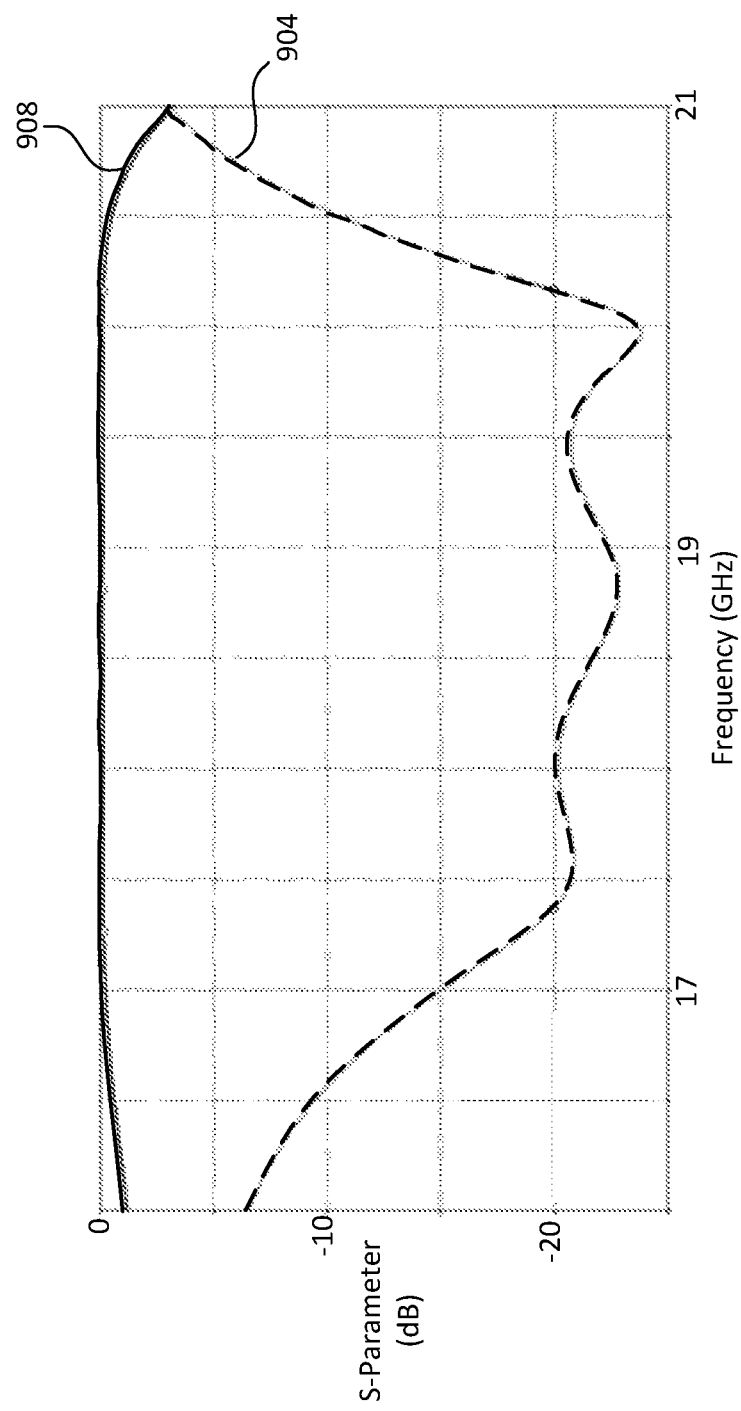
FIG. 9 illustrates an example of a performance graph, in accordance with some implementations.

By way of contrast, FIG. 9 shows an example of a performance graph depicting simulation results for a power splitting (or combining) arrangement that has been configured using disclosed techniques. The arrangement simulated in FIG. 9 has been configured using the techniques described above to directly match to a 35 ohm load without additional impedance matching circuitry. The return loss of this arrangement, depicted by curve 904 of FIG. 9, is approximately 20 dB within a frequency range of 17 to 20 GHz. Additionally, the insertion loss of this arrangement, depicted by curve 908 of FIG. 9, ranges from 0.13 to 0.16 dB within a frequency range of 17 to 20 GHz.

Referring again to FIGS. 1 and 2, it will be appreciated that the present disclosure, advantageously, omits matching circuitry used by conventional splitting (or combining) arrangements. As a result, power splitting (or combining) arrangements 100 and 200, compared with conventional power splitting (or combining) arrangements, have been shown to reduce insertion and mismatch loss introduced by use of such impedance matching circuitry.

Advantageously, a cavity waveguide (enclosed waveguide) has elements internal to the waveguide to perform matching to one or more coaxial output(s) or inputs. This embodiment results in a highly efficient method of transmitting power with minimal loss over a relatively wide band. This is due to the enclosed waveguide structure having higher efficiency than conventional methods to implement matching techniques. Moreover, using a single waveguide containing internal matching circuitry to match with multiple coax output(s) (or input(s)), provides a size and mass savings relative to using a single waveguide input (or output) per coaxial output (or input).

Thus, an improved power combiner/splitter has been disclosed. The foregoing merely illustrates principles of the invention. It will thus be appreciated that those skilled in the art will be able to devise numerous systems and methods which, although not explicitly shown or described herein, embody said principles of the invention and are thus within the spirit and scope of the invention as defined by the following claims.

What is claimed is:

1. An apparatus comprising:
   a power splitting arrangement including a waveguide having a plurality of output ports and an input port configured to receive electromagnetic waves having a frequency in a designated frequency band, wherein:
      each output port is configured to electrically couple with an input terminal of a corresponding one of a plurality of active devices;
      each output port has a respective output impedance associated with the frequency band; and
      the power splitting arrangement is configured such that the respective output impedance of each output port substantially matches an input impedance of the corresponding one of the plurality of active devices such that the power splitting arrangement is configured to provide either or both of:
         a return loss that is not worse than 15 decibels, or
         an insertion loss that is not worse than 0.2 decibels.

2. The apparatus of claim 1, wherein at least one of the plurality of active devices include a transistor amplifier and do not include impedance matching circuitry.

3. The apparatus of claim 2, wherein each output port is electrically coupled with or directly connect to the input terminal of the corresponding one of the plurality of active devices only by way of a microstrip line.

4. The apparatus of claim 1, wherein the power splitting arrangement includes an input splitter waveguide, the apparatus further comprising a serially fed output combiner waveguide having a plurality of input ports, each input port being configured to electrically couple or directly connect to with an output terminal of a corresponding one of the plurality of active devices.

5. The apparatus of claim 1, wherein a first one of the output ports includes a first coaxial interface that is electrically coupled with the waveguide by way of a first coaxial feedthrough, the first coaxial interface being configured to electrically couple with or directly connect to the input terminal of the corresponding active device, the first coaxial interface comprising:
  an electrically conductive core,
  a cylindrical layer comprising a dielectric material, the cylindrical layer surrounding the electrically conductive core, and
  an electrically conductive shell surrounding the dielectric material.

6. The apparatus of claim 5, wherein an inner diameter of the cylindrical layer of the first coaxial interface and an outer diameter of the cylindrical layer of the first coaxial interface are configured such that the output impedance of the first output port substantially matches the input impedance of the corresponding one of the plurality of active devices.

7. The apparatus of claim 5, wherein the dielectric material of the first coaxial interface has a relative permittivity configured such that the first output port has an output impedance that matches the input impedance of the input terminal of the corresponding active device.

8. The apparatus of claim 1, wherein the waveguide includes one or more internal impedance matching components, the internal impedance matching components being configured to substantially match an impedance of the waveguide with input impedances of the output ports.

9. The apparatus of claim 8, wherein the internal impedance matching components include one or more electrically conductive screws embedded in a first wall of the waveguide, wherein a number, a placement, a depth, and/or a diameter of the conductive screws is configured to substantially match the impedance of the waveguide with input impedances of the output ports.

10. The apparatus of claim 8, wherein the impedance matching components include at least one step in a first wall of the waveguide, wherein a number, a placement, and/or a depth of the at least one step is configured to substantially match an impedance of the waveguide with input impedances of the output ports.

11. An apparatus comprising:
  a power combining arrangement including a waveguide having a plurality of input ports and an output port configured to transmit electromagnetic waves having a frequency in a designated frequency band, wherein:
    each input port is configured to electrically couple with or directly connect to an output terminal of a corresponding one of a plurality of active devices;
    each input port has a respective input impedance associated with the frequency band; and
    the power combining arrangement is configured such that the respective input impedance of each input port substantially matches an output impedance of the corresponding one of the plurality of active devices such that the power combining arrangement is configured to provide either or both of:
      a return loss that is not worse than 15 decibels, or
      an insertion loss that is not worse than 0.2 decibels.

12. The apparatus of claim 11, wherein at least one of the plurality of active devices include a transistor amplifier and do not include impedance matching circuitry.

13. The apparatus of claim 12, wherein each input port is electrically coupled with or directly connect to the output terminal of the corresponding one of the plurality of active devices only by way of a microstrip line.

14. The apparatus of claim 11, wherein the power combining arrangement includes an output combiner waveguide, the apparatus further comprising a serially fed input splitter waveguide having a plurality of output ports, each output port being configured to electrically couple with or directly connect to an input terminal of a corresponding one of the plurality of active devices.

15. The apparatus of claim 11, wherein a first one of the input ports includes a first coaxial interface that is electrically coupled with the waveguide by way of a first coaxial feedthrough, the first coaxial interface being configured to electrically couple with or directly connect to the output terminal of the corresponding active device, the first coaxial interface comprising:
  an electrically conductive core,
  a cylindrical layer comprising a dielectric material, the cylindrical layer surrounding the electrically conductive core, and
  an electrically conductive shell surrounding the dielectric material.

16. The apparatus of claim 15, wherein an inner diameter of the cylindrical layer of the first coaxial interface and an outer diameter of the cylindrical layer of the first coaxial interface are configured such that the input impedance of the first input port substantially matches the output impedance of the corresponding one of the plurality of active devices.

17. The apparatus of claim 15, wherein the dielectric material of the first coaxial interface has a relative permittivity configured such that the first port has an input impedance that substantially matches the output impedance of the output terminal of the corresponding active device.

18. The apparatus of claim 11, wherein the waveguide includes one or more internal impedance matching components, the internal impedance matching components being configured to match an impedance of the waveguide with output impedances of the input ports.

19. An apparatus comprising:
  an input splitter waveguide having a plurality of output ports and an input port configured to receive electromagnetic waves having a frequency in a designated frequency band,
  an output combiner waveguide having a plurality of input ports and an output port configured to transmit electromagnetic waves having a frequency in a designated frequency band, and
  a plurality of active devices; wherein:
    each output port of the input splitter waveguide is configured to electrically couple with or directly connect to an input terminal of a corresponding one of the plurality of active devices;
    each output port of the input splitter waveguide has a respective output impedance associated with the frequency band; and
    the power splitting arrangement is configured such that the respective output impedance of each output port of the input splitter waveguide substantially matches an input impedance of the corresponding one of the plurality of active devices such that the power splitting arrangement is configured to provide either or both of a return loss that is not worse than 15 decibels, or an insertion loss that is not worse than 0.2 decibels;
    each input port of the output combiner waveguide is configured to electrically couple with an output terminal of a corresponding one of the plurality of active devices;
    each input port of the output combiner waveguide has a respective input impedance associated with the frequency band; and
    the power combining arrangement is configured such that the respective input impedance of each input port of the output combiner waveguide substantially matches an output impedance of the corresponding one of the plurality of active devices such that the power combining arrangement is configured to provide either or both of: a return loss that is not worse than 15 decibels, or an insertion loss that is not worse than 0.2 decibels.

20. The apparatus of claim 19, wherein:

the active devices include a transistor amplifier and do not include impedance matching circuitry;

each output port of the input splitter waveguide is electrically coupled with or directly connected to the input terminal of the corresponding one of the plurality of active devices only by way of a first microstrip line; and each input port of the output combiner waveguide is electrically coupled with or directly connected to the output terminal of the corresponding one of the plurality of active devices only by way of a second microstrip line.

* * * * *